(12) United States Patent
Farooq et al.

(10) Patent No.: US 6,917,113 B2
(45) Date of Patent: Jul. 12, 2005

(54) LEAD-FREE ALLOYS FOR COLUMN/BALL GRID ARRAYS, ORGANIC INTERPOSERS AND PASSIVE COMPONENT ASSEMBLY

(75) Inventors: Mukta G. Farooq, Hopewell Junction, NY (US); Mario J. Interrante, New Paltz, NY (US)

(73) Assignee: International Business Machines Corporatiion, Armonk, NY (US)

(*) Notice: Subject to any disclaimer, the term of this patent is extended or adjusted under 35 U.S.C. 154(b) by 0 days.

(21) Appl. No.: 10/249,621

(22) Filed: Apr. 24, 2003

(65) Prior Publication Data

US 2004/0212094 A1 Oct. 28, 2004

(51) Int. Cl.⁷ .......................... H01L 23/48; H01L 23/52
(52) U.S. Cl. .............. 257/772; 257/703; 257/775; 257/E21.508; 228/56.3
(58) Field of Search .................. 257/772, 703, 257/775; 228/56.3

(56) References Cited

U.S. PATENT DOCUMENTS

| | | | |
|---|---|---|---|
| 4,778,733 A | 10/1988 | Lubrano et al. | |
| 5,011,658 A | 4/1991 | Niedrich | |
| 5,147,084 A | * 9/1992 | Behun et al. | 228/56.3 |
| 5,672,542 A | * 9/1997 | Schwiebert et al. | 438/4 |
| 5,729,440 A | * 3/1998 | Jimarez et al. | 361/779 |
| 5,863,493 A | 1/1999 | Achari et al. | |
| 6,158,644 A | 12/2000 | Brofman et al. | |
| 6,333,563 B1 | 12/2001 | Jackson et al. | |
| 6,429,388 B1 | 8/2002 | Interrante et al. | |
| 6,436,730 B1 | 8/2002 | Melton et al. | |
| 6,464,122 B1 | 10/2002 | Tadauchi et al. | |
| 6,518,089 B2 | 2/2003 | Coyle | |
| 6,541,305 B2 | 4/2003 | Farooq et al. | |
| 6,574,859 B2 | * 6/2003 | Farooq et al. | 29/890 |
| 6,581,821 B2 | * 6/2003 | Sarkhel | 228/180.21 |
| 6,638,847 B1 | 10/2003 | Cheung et al. | |
| 2001/0018230 A1 | * 8/2001 | Jimarez et al. | 438/108 |
| 2001/0026957 A1 | 10/2001 | Atwood et al. | |
| 2002/0064678 A1 | 5/2002 | Kiyotoki et al. | |
| 2002/0192443 A1 | * 12/2002 | Sarkhel | 428/209 |
| 2002/0192935 A1 | 12/2002 | Joshi et al. | |
| 2003/0230806 A1 | * 12/2003 | Yamashita et al. | 257/741 |

FOREIGN PATENT DOCUMENTS

| | | | | |
|---|---|---|---|---|
| JP | 05136216 A | | 11/1991 | |
| JP | 2001-35978 | * | 7/1999 | ......... H01L/23/40 |
| JP | 2000-301376 A | | 10/2000 | |
| JP | 2002-124533 A | | 4/2002 | |
| WO | 02/063674 A1 | * | 8/2002 | ......... H01L/21/60 |

* cited by examiner

*Primary Examiner*—Jasmine Clark
(74) *Attorney, Agent, or Firm*—James J. Cioffi

(57) ABSTRACT

A lead free solder hierarchy structure for electronic packaging that includes organic interposers. The assembly may also contain passive components as well as underfill material. The lead free solder hierarchy also provides a lead free solder solution for the attachment of a heat sink to the circuit chip with a suitable lead free solder alloy.

53 Claims, 3 Drawing Sheets

LEAD-FREE ALLOYS FOR COLUMN/BALL GRID ARRAYS, ORGANIC INTERPOSERS AND PASSIVE COMPONENT ASSEMBLY

CROSS REFERENCE TO RELATED

This application is related to subject matter described and claimed in U.S. patent application Ser. No. 10/246,282 entitled "Solder Hierarchy For Lead Free Solder Joint" and Ser. No. 10/314,498 entitled "Structure And Method For Lead Free Solder Electronic Package Interconnections" by the inventors of the instant application.

BACKGROUND OF INVENTION

The present invention is directed to electronic packaging and, more particularly, is directed to a lead free solder composition for the assembly of passive components and organic substrates with conventional ceramic packages.

A chip carrier may be attached to a circuit board by a ball grid array (BGA) or column grid array (CGA) comprising solder alloys. Such solder alloys have typically comprised an eutectic alloy composition of Pb/Sn. The chip carrier is typically a ceramic substrate carrying semiconductor chips. The BGA consists of an array of solder balls which are soldered to connecting pads on both the circuit board and the substrate.

U.S. Pat. No. 6,333,563 (Jackson et al.), the disclosure of which is incorporated herein by reference, teaches an organic interposer attached to a ceramic module using a high modulus underfill material. The organic interposer is then joined to an organic board. This assembly increases the fatigue life of the BGA electrical interconnection. The assembly uses standard Pb/Sn solders well known in the art.

For various reasons, however, the Industry is moving to a lead free solder strategy for component assembly. Any lead free interconnect structure will need to accommodate the various solder joint hierarchy temperatures involved. This will include not only conventional chip join and ball grid array to card assembly, but also organic interposer and passive component assembly as well.

Another problem addressed by the present invention relates to cooling the circuit chips. A current thermal solution for cooling circuit chips is to solder a heat sink to the chip. The preferred solder is eutectic PbSn or some combination of Pb and Sn depending on the temperature requirements of the various module interconnect components. As the industry migrates to lead free solder, this soldered chip/heat sink interface is an important consideration in solder hierarchy structure because the heat sink is typically attached to the chip prior to second level module to card assembly.

Accordingly, it is a purpose of the present invention to provide a lead free solder hierarchy structure for electronic packaging that includes organic interposers.

It is another purpose of the present invention to provide a lead free solder hierarchy structure for electronic packaging that includes passive components such as capacitors and resistors.

It is another purpose of the present invention to provide a lead free solder solution for the attachment of a heat sink to the circuit chip.

These and other purposes of the present invention will become more apparent after referring to the following description considered in conjunction with the accompanying drawings.

SUMMARY OF INVENTION

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings.

According to a first aspect of the invention there is provided a solder interconnect structure for electronic package interconnections comprising:

at least one electronic circuit chip attached to a top surface of a chip carrier with a first array of solder connections, the first array of solder connections having a first lead free off-eutectic solder composition;

a second array of solder connections attached to a bottom surface of the chip carrier, the second array of solder connections having a second lead free off-eutectic solder composition, the second lead free off-eutectic solder composition having a lower liquidus temperature than the first lead free off-eutectic solder composition;

an organic interposer having a top surface attached to the second array of solder connections;

a third array of solder connections attached to a bottom surface of the organic interposer, the third array of solder connections having a third lead free off-eutectic solder composition, the third lead free off-eutectic solder composition having a lower liquidus temperature than the second lead free off-eutectic solder composition; and a circuit board having a top side attached to the third array of solder connections to create a solder interconnect structure.

The organic interposer to circuit board solder connection may alternatively be an approximately eutectic Sn/Pb solder composition. The structure may also contain passive components and underfill material at the chip to chip carrier and chip carrier to interposer interfaces.

According to another aspect of the invention, there is provided a solder interconnect structure for electronic package interconnections comprising: at least one electronic circuit chip attached to a top side of a chip carrier with a first array of solder connections, the first array of solder connections having a first lead free off-eutectic solder composition;

a second array of solder connections having a first end attached to a bottom surface of the chip carrier with a second lead free off-eutectic solder composition, the second lead free off-eutectic solder composition having a lower liquidus temperature than the first lead free off-eutectic solder composition;

an organic interposer having a top surface attached to a second side of the second array of solder connections by a third lead free off-eutectic solder composition, the third lead free off-eutectic solder composition having a lower liquidus temperature than the second lead free off-eutectic solder composition;

a third array of solder connections attached to a bottom surface of the organic interposer, the third array of solder connections having a fourth lead free off-eutectic solder composition, the fourth lead free off-eutectic solder composition having a lower liquidus temperature than the third lead free off-eutectic solder composition;

and a circuit board having a top surface attached to the third array of solder connections to create a solder interconnect structure.

The organic interposer to circuit board solder connection may alternatively be an approximately eutectic Sn/Pb solder composition.

According to another aspect of the invention, there is provided a solder hierarchy structure for electronic package interconnections comprising:

an electronic module;

an array of solder columns having a first end attached to a bottom side of the module with a lead free solder composition; and a circuit board having a top side attached to a second end of the array of solder columns by a Sn/Pb solder composition.

According to another aspect of the invention, there is provided a lead free solder structure for attaching a heat sink to a circuit chip comprising:

a circuit chip;

metallized layers on the chip;

a heat sink;

metallized layers on the heat sink; and a lead free solder connecting the heat sink to the chip.

BRIEF DESCRIPTION OF DRAWINGS

The features of the invention believed to be novel and the elements characteristic of the invention are set forth with particularity in the amended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

The purposes of the present invention have been achieved by providing, according to the present invention, a variety of solder interconnect structures employing a lead free solder temperature hierarchy which enables lead free solder solutions to be applied to complex module assemblies including organic interposers, heat sinks, and passive components.

The present invention employs the use of lead free solder alloys. In one embodiment an off-eutectic solder composition of between 90.0–99.0 weight % Sn, between 10.0–1.0 weight % Cu, and having inter-metallics with a melting temperature above 280° C. Preferred embodiments are 93Sn/7Cu and 97Sn/3Cu, both compositions having dispersed grains of SnCu inter-metallic phase structure.

In another embodiment an off-eutectic solder composition of between 70.0–96.0 weight % Sn, between 30.0–4.0 weight % Ag, and having inter-metallics with a melting temperature above 280° C. Preferred embodiments are 72Sn/28Ag, 78Sn/22Ag and 82Sn/18Ag, all compositions having dispersed grains of SnAg inter-metallic phase structure.

A first embodiment of the present invention will be discussed with reference to FIG. 1. At least one circuit chip 10 is attached to a top surface of a chip carrier 20 with a first array of solder connections 30. In this embodiment the first array of solder connections 30 are comprised of a lead free off-eutectic solder composition. In a preferred embodiment the first array of solder connections 30 are a composition of about 72.0 weight % Sn and 28.0 weight % Ag, having dispersed grains of SnAg inter-metallic phase structure and a liquidus temperature of approximately 400° C.

A second array of solder connections 40 is used to attach the chip carrier 20 to an organic interposer 50. In this embodiment the second array of solder connections 40 are comprised of a lead free off-eutectic solder composition having a lower liquidus temperature than the first array of solder connections 30. In a preferred embodiment the second array of solder connections 40 are a composition of about 78.0 weight % Sn and 22.0 weight % Ag, having dispersed grains of SnAg Inter-metallic phase structure and a liquidus temperature of approximately 375° C.

A third array of solder connections 60 is used to attach the organic interposer 50 to a printed circuit board 70. In this embodiment the third array of solder connections 60 are comprised of a lead free off-eutectic solder composition having a lower liquidus temperature than the second array of solder connections 40. In a preferred embodiment the third array of solder connections 60 are a composition of about 95.5 weight % Sn and about 3.8 weight % Ag and about 0.7 weight % Cu and has a liquidus temperature of approximately 217° C. The organic interposer 50 is preferably fabricated from a material which has an expansion coefficient similar to the circuit board 70. For example, the organic interposer 50, or the circuit board 70, could consist of FR4, FR4 with surface laminate circuits, or organic carriers with at least one metal and at least one polyimide layer.

In a preferred embodiment, the solder interconnect structure may also have a first underfill encapsulation material 80 surrounding the first array of solder connections 30. Additionally, the solder interconnect structure may have a second underfill encapsulation material 90 surrounding the second array of solder connections 40. The underfill material 80, 90 is preferably a high modulus material which couples the chip 10 to the chip carrier 20 or the organic interposer 50 to the chip carrier 20 and limits the ability to expand freely. Examples of commercially available underfill material are Hysol 4526 from Dexter and 8800 series underfill from Johnson Mathey.

The solder interconnect structure may also consist of passive components 100 attached to the chip carrier 20. Typical passive components include capacitors, resistors and thermistors. In this embodiment the passive components 100 are attached to the chip carrier 20 with a lead free off-eutectic solder composition 110 having a liquidus temperature lower than the first array of solder connections 30. In a preferred embodiment, the solder composition 110 is about 78.0 weight % Sn and 22.0 weight % Ag, and has dispersed grains of SnAg inter-metallic phase structure and a liquidus temperature of approximately 375° C. In another preferred embodiment the solder composition 110 is 78Sn/22Ag but the second array of solder connections 40 are comprised of a lead free off-eutectic solder composition of about 82.0 weight % Sn and 18.0 weight % Ag, having dispersed grains of SnAg inter-metallic phase structure and a liquidus temperature of approximately 355° C.

Figure 1:
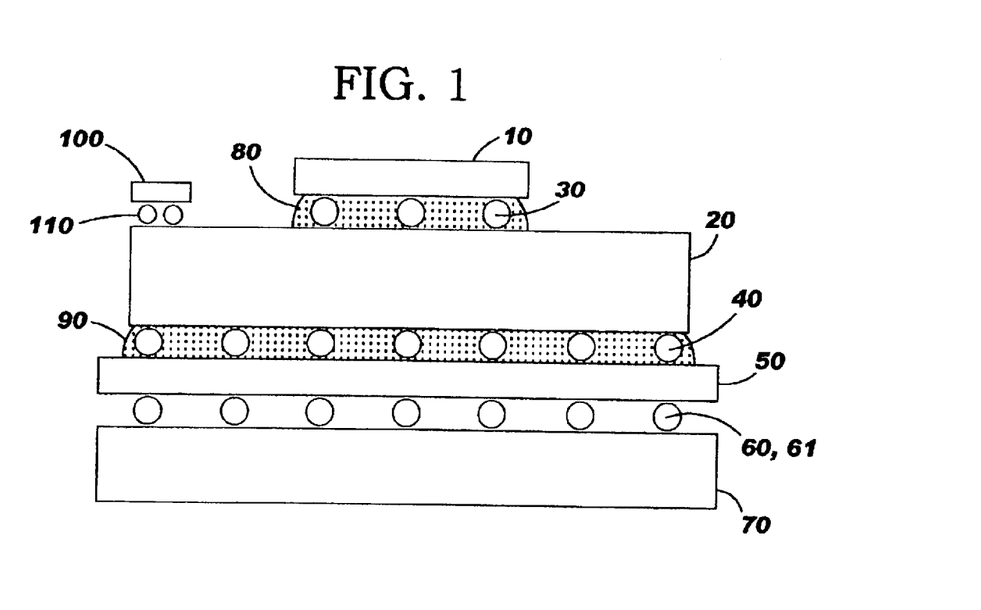
FIG. 1 is a schematic view of a chip/chip carrier/organic interposer/circuit board assembly.

The solder connections 30, 40 and 60 shown in FIG. 1 are solder balls. However the present invention is not limited to solder balls and it will be appreciated by those skilled in the art that these solder connections may also be "columns", "springs". "s-connectors", "c-connectors", "cantilever beams" or any solder joint assembly.

The solder interconnect structure shown in FIG. 1 is not limited to an all lead free off-eutectic solder assembly. For example, the passive components 100 may be attached to the chip carrier 20 with a Sn/Pb solder composition having a liquidus temperature lower than the liquidus temperature of the first array of solder connections 30. Alternatively, either a Sn/Bi or a Sn/In solder composition having a liquidus temperature lower than the liquidus temperature of the first array of solder connections 30 may also be used. In addition, the third array of solder connections 60 may consist of a eutectic Sn/Pb solder composition 61. In a preferred embodiment the Sn/Pb solder composition is a eutectic composition of approximately 63.0 weight % Sn and 37.0 weight % Pb. However a slightly off-eutectic Sn/Pb solder composition in the range of approximately 58 to 70 weight % Sn and approximately 42 to 30 weight % Pb may be used as well.

Figure 2:
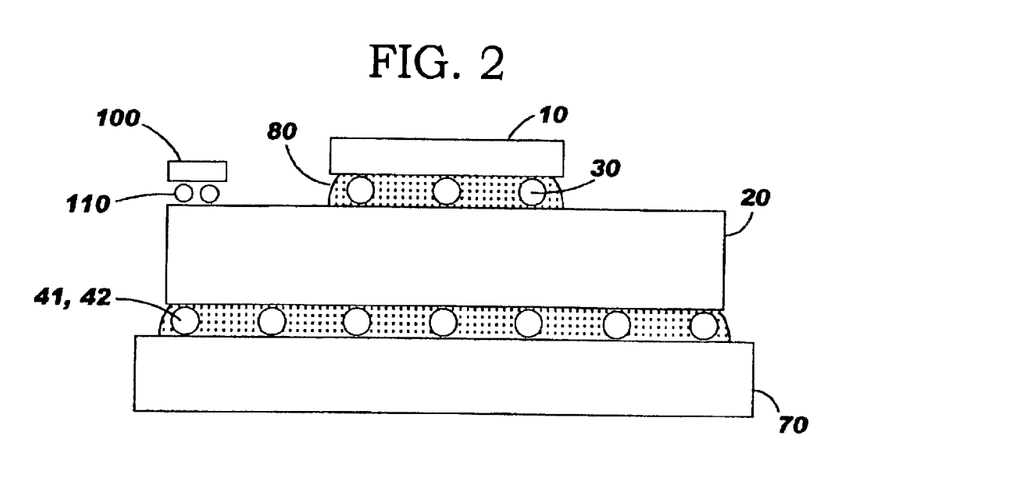
FIG. 2 is a schematic view of a chip/chip carrier/circuit board assembly.

Referring now to FIG. 2 there is shown a solder interconnect structure, including passive components, but without an organic interposer, according to another embodiment of the present invention. At least one circuit chip 10 is attached to a top surface of a chip carrier 20 with a first array of solder connections 30. As in the previous embodiment, the first array of solder connections 30 are comprised of a lead free off-eutectic solder composition, preferably about 72.0 weight % Sn and 28.0 weight % Ag, having dispersed grains of SnAg inter-metallic phase structure and a liquidus temperature of approximately 400° C.

At least one passive component 100 is attached to the chip carrier 20 with a lead free off-eutectic solder composition 110 having a liquidus temperature lower than the first array of solder connections 30. In a preferred embodiment, the solder composition 110 is about 78.0 weight % Sn and 22.0 weight % Ag, and has dispersed grains of SnAg inter-metallic phase structure and a liquidus temperature of approximately 375° C. In another preferred embodiment the solder composition 110 is a lead free off-eutectic solder composition of about 82.0 weight % Sn and 18.0 weight % Ag, having dispersed grains of SnAg inter-metallic phase structure and a liquidus temperature of approximately 355° C.

A second array of solder connections 41 is used to attach the chip carrier 20 to a circuit board 70. In this embodiment the second array of solder connections 41 are comprised of a lead free off-eutectic solder composition having a lower liquidus temperature than the first array of solder connections 30. In a preferred embodiment the second array of solder connections 41 have a composition of about 95.5 weight % Sn and about 3.8 weight % Ag and about 0.7 weight % Cu and have a liquidus temperature of approximately 217° C.

The solder interconnect structure shown in FIG. 2 is also not limited to an all lead free off-eutectic solder assembly. For example, the passive components 100 may be attached to the chip carrier 20 with a Sn/Pb solder composition having a liquidus temperature lower than the liquidus temperature of the first array of solder connections 30. Alternatively, either a Sn/Bi or a Sn/In solder composition having a liquidus temperature lower than the liquidus temperature of the first array of solder connections 30 may also be used. In addition, the second array of solder connections 41 may consist of a eutectic Sn/Pb solder composition 42. In a preferred embodiment the Sn/Pb solder composition is a eutectic composition of approximately 63.0 weight % Sn and 37.0 weight % Pb. However a slightly off-eutectic Sn/Pb solder composition in the range of approximately 58 to 70 weight % Sn and approximately 42 to 30 weight % Pb may be used as well.

Another embodiment of the present invention will be discussed with reference to FIG. 3. At least one circuit chip 10 is attached to a top surface of a chip carrier 20 with a first array of solder connections 30. In this embodiment the first array of solder connections 30 are comprised of a lead free off-eutectic solder composition. In a preferred embodiment the first array of solder connections 30 are a composition of about 72.0 weight % Sn and 28.0 weight % Ag, having dispersed grains of SnAg inter-metallic phase structure and a liquidus temperature of approximately 400° C.

A second array of solder connections 43 is used to attach the chip carrier 20 to an organic interposer 50. A first end of the solder connection 43 is attached to the bottom of the chip carrier 20 with a second lead free off-eutectic solder composition 44 having a lower liquidus temperature than the first array of solder connections 30. In a preferred embodiment the second lead free off-eutectic solder composition 44 is about 78.0 weight % Sn and 22.0 weight % Ag, having dispersed grains of SnAg inter-metallic phase structure and a liquidus temperature of approximately 375° C. A second end of the solder connection 43 is attached to the organic interposer 50 with a third lead free off-eutectic solder composition 45 having a lower liquidus temperature than the second lead free off-eutectic solder composition 44. In a preferred embodiment the third lead free off-eutectic solder composition 45 is about 82.0 weight % Sn and 18.0 weight % Ag, having dispersed grains of SnAg inter-metallic phase structure and a liquidus temperature of approximately 355° C.

A third array of solder connections 62 is used to attach the organic interposer 50 to a printed circuit board 70. In this embodiment the third array of solder connections 62 are comprised of a fourth lead free off-eutectic solder composition having a lower liquidus temperature than the third lead free off-eutectic solder composition 45. In a preferred embodiment the third array of solder connections 62 are a composition of about 95.5 weight % Sn and about 3.8 weight % Ag and about 0.7 weight % Cu and has a liquidus temperature of approximately 217° C.

Figure 3:
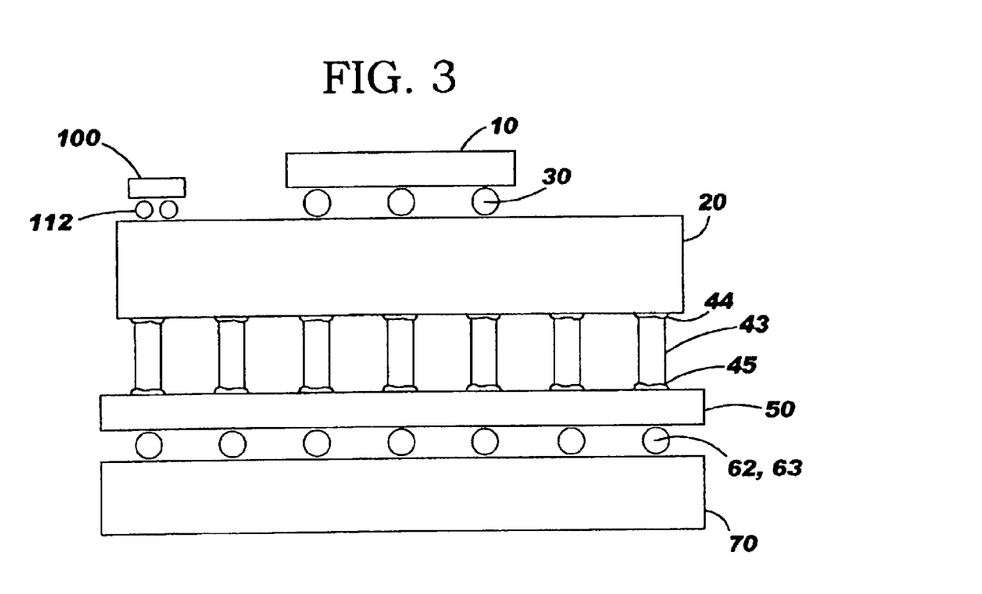
FIG. 3 is a schematic view of a chip/chip carrier/organic interposer/circuit board assembly using solder columns.

The solder interconnect structure shown in FIG. 3 may also contain passive components 100 attached to the chip carrier 20. In this embodiment the passive components 100 are attached to the chip carrier 20 with a fifth lead free off-eutectic solder composition 112 having a liquidus temperature lower than the first array of solder connections 30. In a preferred embodiment, the fifth lead free off-eutectic solder composition 112 is about 78.0 weight % Sn and 22.0 weight % Ag, and has dispersed grains of SnAg inter-metallic phase structure and a liquidus temperature of approximately 375° C. In another preferred embodiment the fifth lead free off-eutectic solder composition 112 is 78Sn/22Ag but the second lead free off-eutectic solder composition 44 is about 82.0 weight % Sn and 18.0 weight % Ag, having dispersed grains of SnAg inter-metallic phase structure and a liquidus temperature of approximately 355° C.

The solder interconnect structure shown in FIG. 3 is not limited to an all lead free off-eutectic solder assembly. For example, the passive components 100 may be attached to the chip carrier 20 with a Sn/Pb solder composition having a liquidus temperature lower than the liquidus temperature of the first array of solder connections 30. Alternatively, either a Sn/Bi or a Sn/In solder composition having a liquidus temperature lower than the liquidus temperature of the first array of solder connections 30 may also be used. In addition, the third array of solder connections 62 may consist of a eutectic Sn/Pb solder composition 63. In a preferred embodiment the Sn/Pb solder composition is a eutectic composition of approximately 63.0 weight % Sn and 37.0 weight % Pb. However a slightly off-eutectic Sn/Pb solder composition in the range of approximately 58 to 70 weight % Sn and approximately 42 to 30 weight % Pb may be used as well.

Figure 4:
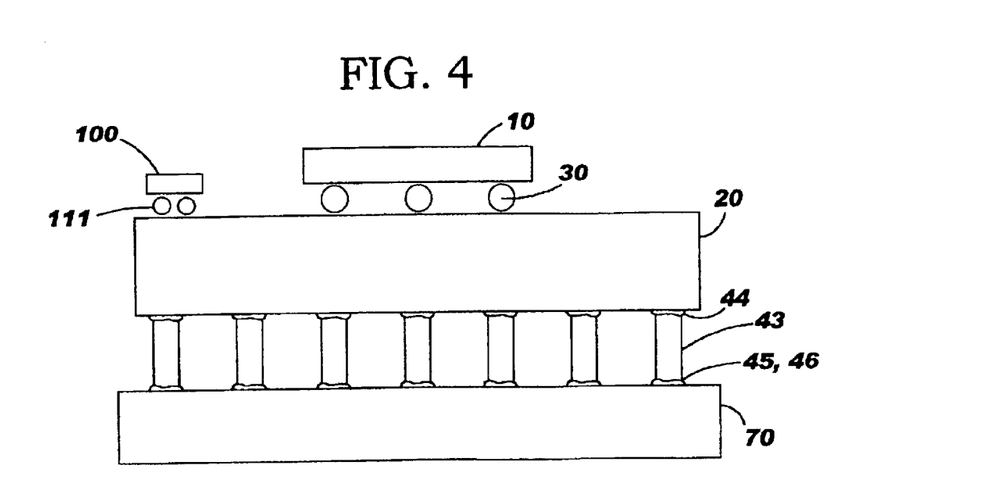
FIG. 4 is a schematic view of a chip/chip carrier/circuit board assembly using solder columns.

Referring now to FIG. 4 there is shown a solder interconnect structure, including passive components, but without an organic interposer, according to another embodiment of the present invention. At least one circuit chip 10 is attached to a top surface of a chip carrier 20 with a first array of solder connections 30. The first array of solder connections 30 are comprised of a first lead free off-eutectic solder composition, preferably about 72.0 weight % Sn and 28.0 weight % Ag, having dispersed grains of SnAg inter-metallic phase structure and a liquidus temperature of approximately 400° C.

At least one passive component 100 is attached to the chip carrier 20 with a second lead free off-eutectic solder composition 111 having a liquidus temperature lower than the first array of solder connections 30. In a preferred embodiment, the second lead free off-eutectic solder composition 117 is about 78.0 weight % Sn and 22.0 weight % Ag, and has dispersed grains of SnAg inter-metallic phase structure and a liquidus temperature of approximately 375° C.

A second array of solder connections 43 is used to attach the chip carrier 20 to a circuit board 70. A first end of the solder connection 43 is attached to the bottom of the chip carrier 20 with a third lead free off-eutectic solder composition 44 having a lower liquidus temperature than the second lead free off-eutectic solder composition 111. In a preferred embodiment the third lead free off-eutectic solder composition 44 is about 82.0 weight % Sn and 18.0 weight % Ag, having dispersed grains of SnAg inter-metallic phase structure and a liquidus temperature of approximately 355° C. A second end of the solder connection 43 is attached to the circuit board 70 with a fourth lead free off-eutectic solder composition 45 having a lower liquidus temperature than the third lead free off-eutectic solder composition 44. In a preferred embodiment the fourth lead free off-eutectic solder composition 45 is about 95.5 weight % Sn and about 3.8 weight % Ag and about 0.7 weight % Cu and has a liquidus temperature of approximately 217° C.

In an alternative to the above embodiment, both the second lead free off-eutectic solder composition 111 and the third lead free off-eutectic solder composition 44 may both be about 82.0 weight % Sn and 18.0 weight % Ag. Additionally, the solder interconnect structure shown in FIG. 4 is not limited to an all lead free off-eutectic solder assembly. For example, the passive components 100 may be attached to the chip carrier 20 with a Sn/Pb solder composition having a liquidus temperature lower than the liquidus temperature of the first array of solder connections 30. Alternatively, either a Sn/Bi or a Sn/In solder composition having a liquidus temperature lower than the liquidus temperature of the first array of solder connections 30 may also be used. In addition, the second array of solder connections 43 may be attached to the circuit board 70 with a eutectic Sn/Pb solder composition 46. In a preferred embodiment the Sn/Pb solder composition 46 is a eutectic composition of approximately 63.0 weight % Sn and 37.0 weight % Pb. However a slightly off-eutectic Sn/Pb solder composition in the range of approximately 58 to 70 weight % Sn and approximately 42 to 30 weight % Pb may be used as well.

Figure 5:
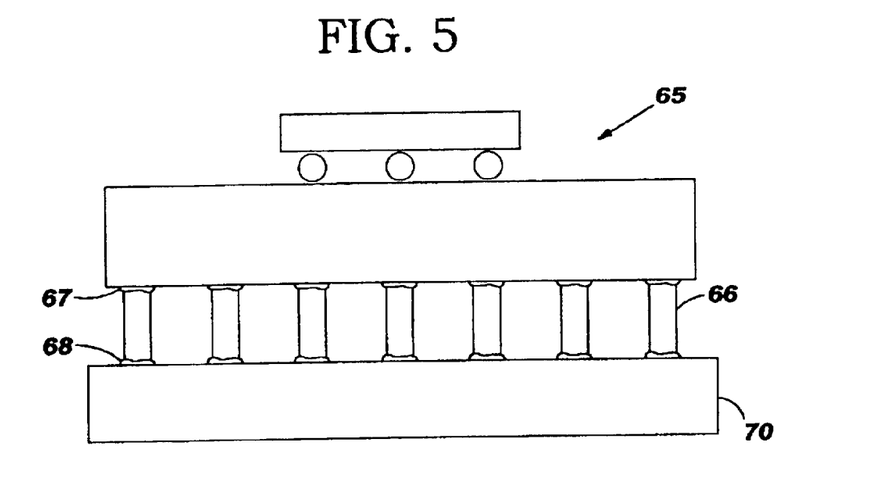
FIG. 5 is a schematic view of a chip/chip carrier/circuit board assembly using solder columns.

Referring to FIG. 5 there is shown another embodiment of the present invention. A solder hierarchy structure for electronic package interconnections is comprised of an electronic module 65 which is attached to a circuit board 70 with an array of solder columns 66. The electronic module 65 may be any conventional ceramic or organic chip carrier with or without passive components. A first end of the columns 66 are attached to the bottom side of the module 65 with a lead free solder composition 67. The top surface of the circuit board 70 is attached to the second end of the array of solder columns 66 by a eutectic or near eutectic Sn/Pb solder composition 68. In a preferred embodiment the Sn/Pb solder composition is a eutectic composition of approximately 63.0 weight % Sn and 37.0 weight % Pb. However a slightly off-eutectic Sn/Pb solder composition in the range of approximately 58 to 70 weight % Sn and approximately 42 to 30 weight % Pb may be used as well.

In one preferred embodiment the lead free solder composition 67 is a Sn/Ag solder composition. Preferred compositions include approximately 78 weight % Sn and 22 weight % Ag, approximately 82 weight % Sn and 18 weight % Ag, approximately 72 weight % Sn and 28 weight % Ag and approximately 96.5 weight % Sn and 3.5 weight % Ag.

In another preferred embodiment the lead free solder composition 67 is a Sn/Cu solder composition. Preferred compositions include approximately 93 weight % Sn and 7 weight % Cu, approximately 97 weight % Sn and 3 weight % Cu and approximately 99.3 weight % Sn and 0.7 weight % Cu.

Figure 6:
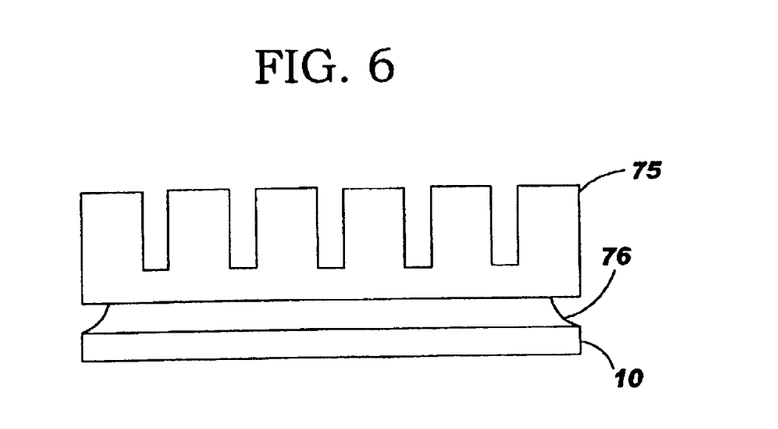
FIG. 6 is a schematic view of a lead free solder structure for attaching a heat sink to a circuit chip.

In another embodiment of the present invention there is shown in FIG. 6 a lead free solder structure for attaching a heat sink 75 to a circuit chip 10 with a lead free solder 76. The mating surface of the chip 10 and heat sink 75 are metallized with a suitable wettable surface (not shown), such as Nickel or Gold, and which are well known in the art. In one embodiment the lead free solder 76 is a Sn/Ag solder composition comprised of approximately 72 to 96.5 weight % Sn and 28 to 3.5 weight % Ag. In another embodiment the lead free solder 76 is a Sn/Cu solder composition comprised of approximately 93 to 99.3 weight % Sn and 7 to 0.7 weight % Cu.

In another embodiment the lead free solder structure 76 is a layered solder preform of Sn/Ag/Sn. In a preferred embodiment the lead free layered solder preform comprises a first layer of Sn approximately 10 mils thick; a layer of Ag approximately 5 mils thick, the layer of Ag contiguous with the first layer of Sn; and a second layer of Sn approximately 10 mil thick, the second layer of Sn contiguous with the layer of Ag.

In this embodiment the layers of 10 mil thickness (0.01 inch) Tin, 5 mil thickness (0.005 inch) Silver and 10 mil thickness (0.01 inch) Tin would result in an off-eutectic SnAg alloy of approximately 80Sn/20Ag vol % once reflowed. The reflow temperature would be approximately 235° C. but the resulting off-eutectic heat sink/chip solder thermal interface would remain stable at temperatures up to 300° C.

In a preferred method commercially available Tin and Silver ribbon is cut roughly to the same planar area size as the chip. The Sn/Ag/Sn layered sandwich structure described above is placed on the metallized (Nickel/Gold etc.) back of the chip and held in place with a solder flux. The heat sink, also metallized, is then placed on the layered Sn/Ag/Sn solder structure on the chip. The assembly is then furnace reflowed to melt the solder structure. The top and bottom layers of Tin readily react with the metallized layers on the chip and heat sink forming a good bond. The remaining solder forms uniform areas of off-eutectic SnAg during reflow.

Once the preform is melted or reflowed it will result in a Sn/Ag off-eutectic soldered thermal interface with the appropriate temperature hierarchy to remain stable during subsequent module/card join assembly. The thickness of each layer would be determined to provide provide a specific solder structure during the heat sink to chip attach reflow.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A solder interconnect structure for electronic package interconnections comprising:

at least one electronic circuit chip attached to a top surface of a chip carrier with a first array of solder connections, said first array of solder connections having a first lead free off-eutectic solder composition;

a second array of solder connections attached to a bottom surface of said chip carrier, said second array of solder connections having a second lead free off-eutectic solder composition, said second lead free off-eutectic solder composition having a lower liquidus temperature than said first lead free off-eutectic solder composition;

an organic interposer having a top surface attached to said second array of solder connections;

a third array of solder connections attached to a bottom surface of said organic interposer, said third array of solder connections having a third lead free off-eutectic solder composition, said third lead free off-eutectic solder composition having a lower liquidus temperature than said second lead free off-eutectic solder composition; and a circuit board having a top side attached to said third array of solder connections to create a solder interconnect structure.

2. The solder interconnect structure of claim 1 wherein said first lead free off-eutectic solder composition is about 72.0 weight % Sn and 28.0 weight % Ag, and having dispersed grains of SnAg inter-metallic phase structure and a liquidus temperature of approximately 400° C.;

wherein said second lead free off-eutectic solder composition is about 78.0 weight % Sn and 22.0 weight % Ag, and having dispersed grains of SnAg inter-metallic phase structure and a liquidus temperature of approximately 375° C.; and wherein said third lead free off-eutectic solder composition is about 95.5 weight % Sn and 3.8 weight % Ag and 0.7 weight % Cu and has a liquidus temperature of approximately 217° C.

3. The solder interconnect structure of claim 1 further comprising a first underfill encapsulation material surrounding said first array of solder connections.

4. The solder interconnect structure of claim 3 further comprising a second underfill encapsulation material surrounding said second array of solder connections.

5. The solder interconnect structure of claim 1 further comprising at least one passive component attached to said chip carrier with a fourth lead free off-eutectic solder composition having a liquidus temperature lower than said first array of solder connections.

6. The solder interconnect structure of claim 5 wherein said fourth lead free off-eutectic solder composition is about 78.0 weight % Sn and 22.0 weight % Ag, and has dispersed grains of SnAg inter-metallic phase structure and a liquidus temperature of approximately 375° C.

7. The solder interconnect structure of claim 5 wherein said fourth lead free off-eutectic solder composition is about 78.0 weight % Sn and 22.0 weight % Ag, and having dispersed grains of SnAg inter-metallic phase structure and a liquidus temperature of approximately 375° C.; and wherein said second lead free off-eutectic solder composition is about 82.0 weight % Sn and 18.0 weight % Ag, and having dispersed grains of SnAg inter-metallic phase structure and a liquidus temperature of approximately 355° C.

8. The solder interconnect structure of claim 5 wherein said at least one passive component is a capacitor.

9. The solder interconnect structure of claim 5 wherein said at least one passive component is a resistor.

10. The solder interconnect structure of claim 5 wherein said at least one passive component is a thermistor.

11. The solder interconnect structure of claim 1 wherein said second array of solder connections and said third array of solder connections are solder columns.

12. The solder interconnect structure of claim 1 wherein said second array of solder connections and said third array of solder connections are solder balls.

13. The solder interconnect structure of claim 1 further comprising at least one passive component attached to said chip carrier with a Sn/Pb solder composition having a liquidus temperature lower than the liquidus temperature of said first lead free off-eutectic solder composition.

14. The solder interconnect structure of claim 1 further comprising at least one passive component attached to said chip carrier with a Sn/Bi solder composition having a liquidus temperature lower than the liquidus temperature of said first lead free off-eutectic solder composition.

15. The solder interconnect structure of claim 1 further comprising at least one passive component attached to said chip carrier with a Sn/In solder composition having a liquidus temperature lower than the liquidus temperature of said first lead free off-eutectic solder composition.

16. A solder interconnect structure for electronic package interconnections comprising:

at least one electronic circuit chip attached to a top surface of a chip carrier with a first array of solder connections, said first array of solder connections having a first lead free off-eutectic solder composition;

a second array of solder connections attached to a bottom surface of said chip carrier, said second array of solder connections having a second lead free off-eutectic solder composition, said second lead free off-eutectic solder composition having a lower liquidus temperature than said first lead free off-eutectic solder composition;

an organic interposer having a top surface attached to said first array of solder connections;

a third array of solder connections attached to a bottom surface of said organic interposer, said third array of solder connections having an approximately eutectic Sn/Pb solder composition; and a circuit board having a top side attached to said second array of solder connections to create a solder interconnect structure.

17. A solder interconnect structure for electronic package interconnections comprising:
- at least one electronic circuit chip attached to a top side of a chip carrier with a first array of solder connections, said first array of solder connections having a first lead free off-eutectic solder composition;
- at least one passive component attached to said chip carrier with a second lead free off-eutectic solder composition, said second lead free off-eutectic solder composition having a lower liquidus temperature than said first lead free off-eutectic solder composition;
- a second array of solder connections attached to a bottom side of said chip carrier, said second array of solder connections having a third lead free off-eutectic solder composition, said third lead free off-eutectic solder composition having a lower liquidus temperature than said second lead free off-eutectic solder composition; and
- a circuit board having a top side attached to said second array of solder connections to create a solder interconnect structure.

18. The solder interconnect structure of claim 17 wherein said first lead free off-eutectic solder composition is about 72.0 weight % Sn and 28 weight % Ag, and having dispersed grains of SnAg inter-metallic phase structure and a liquidus temperature of approximately 400° C.;
- wherein said second lead free off-eutectic solder composition is about 78.0 weight % Sn and 22.0 weight % Ag, and having dispersed grains of SnAg inter-metallic phase structure and a liquidus temperature of approximately 375° C.; and
- wherein said third lead free off-eutectic solder composition is about 95.5 weight % Sn and 3.8 weight % Ag and 0.7 weight % Cu and has a liquidus temperature of approximately 217° C.

19. The solder interconnect structure of claim 17 wherein said first lead free off-eutectic solder composition is about 72.0 weight % Sn and 28 weight % Ag, and having dispersed grains of SnAg inter-metallic phase structure and a liquidus temperature of approximately 400° C.;
- wherein said second lead free off-eutectic solder composition is about 82.0 weight % Sn and 18.0 weight % Ag, and having dispersed grains of SnAg inter-metallic phase structure and a liquidus temperature of approximately 355° C.; and
- wherein said third lead free off-eutectic solder composition is about 95.5 weight % Sn and 3.8 weight % Ag and 0.7 weight % Cu and has a liquidus temperature of approximately 217° C.

20. The solder interconnect structure of claim 17 wherein said second array of solder connections are solder columns.

21. The solder interconnect structure of claim 17 wherein said second array of solder connections are solder balls.

22. A solder interconnect structure for electronic package interconnections comprising:
- at least one electronic circuit chip attached to a top side of a chip carrier with a first array of solder connections said first array of solder connections having a first lead free off-eutectic solder composition;
- at least one passive component attached to said chip carrier with a second lead free off-eutectic solder composition, said second lead free off-eutectic solder composition having a lower liquidus temperature than said first lead free off-eutectic solder composition;
- a second array of solder connections attached to a bottom side of said chip carrier, said second array of solder connections having a eutectic Sn/Pb solder composition; and
- a circuit board having a top side attached to said second array of solder connections to create a solder interconnect structure.

23. A solder interconnect structure for electronic package interconnections comprising:
- at least one electronic circuit chip attached to a top side of a chip carrier with a first array of solder connections, said first array of solder connections having a first lead free off-eutectic solder composition;
- a second array of solder connections having a first end attached to a bottom surface of said chip carrier with a second lead free off-eutectic solder composition, said second lead free off-eutectic solder composition having a lower liquidus temperature than said first lead free off-eutectic solder composition;
- an organic interposer having a top surface attached to a second side of said second array of solder connections by a third lead free off-eutectic solder composition, said third lead free off-eutectic solder composition having a lower liquidus temperature than said second lead free off-eutectic solder composition;
- a third array of solder connections attached to a bottom surface of said organic interposer, said third array of solder connections having a fourth lead free off-eutectic solder composition, said fourth lead free off-eutectic solder composition having a lower liquidus temperature than said third lead free off-eutectic solder composition; and
- a circuit board having a top surface attached to said third array of solder connections to create a solder interconnect structure.

24. The solder interconnect structure of claim 23 wherein said first lead free off-eutectic solder composition is about 72.0 weight % Sn and 28.0 weight % Ag, and having dispersed grains of SnAg inter-metallic phase structure and a liquidus temperature of approximately 400° C.;
- wherein said second lead free off-eutectic solder composition is about 78.0 weight % Sn and 22.0 weight % Ag, and having dispersed grains of SnAg inter-metallic phase structure and a liquidus temperature of approximately 375° C.;
- wherein said third lead free off-eutectic solder composition is about 82.0 weight % Sn and 18.0 weight % Ag, and having dispersed grains of SnAg inter-metallic phase structure and a liquidus temperature of approximately 355° C.; and
- wherein said fourth lead free off-eutectic solder composition is about 95.5 weight % Sn and 3.8 weight % Ag and 0.7 weight % Cu and has a liquidus temperature of approximately 217° C.

25. The solder interconnect structure of claim 23 wherein said second array of solder connections are solder columns.

26. The solder interconnect structure of claim 23 wherein said second array of solder connections are solder balls.

27. The solder interconnect structure of claim 23 further comprising at least one passive component attached to said chip carrier with a fifth lead free off-eutectic solder composition.

28. The solder interconnect structure of claim 27 wherein said fifth lead free off-eutectic solder composition is about 78.0 weight % Sn and 22.0 weight % Ag, and having dispersed grains of SnAg inter-metallic phase structure and a liquidus temperature of approximately 375° C.

29. The solder interconnect structure of claim 27 wherein said fifth lead free off-eutectic solder composition is about 78.0 weight % Sn and 22.0 weight % Ag, and having dispersed grains of SnAg inter-metallic phase structure and a liquidus temperature of approximately 375° C.; and wherein said second lead free off-eutectic solder composition is about 82.0 weight % Sn and 18.0 weight % Ag, and having dispersed grains of SnAg inter-metallic phase structure and a liquidus temperature of approximately 355° C.

30. A solder interconnect structure for electronic package interconnections comprising:

at least one electronic circuit chip attached to a top side of a chip carrier with a first array of solder connections, said first array of solder connections having a first lead free off-eutectic solder composition;

a second array of solder connections having a first end attached to a bottom surface of said chip carrier with a second lead free off-eutectic solder composition, said second lead free off-eutectic solder composition having a lower liquidus temperature than said first lead free off-eutectic solder composition;

an organic interposer having a top surface attached to a second side of said second array of solder connections by a third lead free off-eutectic solder composition, said third lead free off-eutectic solder composition having a lower liquidus temperature than said second lead free off-eutectic solder composition;

a third array of solder connections attached to a bottom surface of said organic interposer, said third array of solder connections having a eutectic Sn/Pb solder composition, and a circuit board having a top surface attached to said third array of solder connections to create a solder interconnect structure.

31. A solder interconnect structure for electronic package interconnections comprising:

at least one electronic circuit chip attached to a top side of a chip carrier with a first array of solder connections, said first array of solder connections having a first lead free off-eutectic solder composition;

at least one passive component attached to said chip carrier with a second lead free off-eutectic solder composition, said second lead free off-eutectic solder composition having a lower liquidus temperature than said first lead free off-eutectic solder composition;

a second array of solder connections having a first end attached to a bottom side of said chip carrier with a third lead free off-eutectic solder composition, said third lead free off-eutectic solder composition having a lower liquidus temperature than said second lead free off-eutectic solder composition; and a circuit board having a top side attached to a second end of said second array of solder connections by a fourth lead free solder composition, said fourth lead free solder composition having a lower liquidus temperature than said third off-eutectic lead free solder composition to create a solder interconnect structure.

32. The solder interconnect structure of claim 31 wherein said first lead free off-eutectic solder composition is about 72.0 weight % Sn and 28.0 weight % Ag, and having dispersed grains of SnAg inter-metallic phase structure and a liquidus temperature of approximately 400° C.;

wherein said second lead free off-eutectic solder composition is about 78.0 weight % Sn and 22.0 weight % Ag, and having dispersed grains of SnAg inter-metallic phase structure and a liquidus temperature of approximately 375° C.;

wherein said third lead free off-eutectic solder composition is about 82.0 weight % Sn and 18.0 weight % Ag, and having dispersed grains of SnAg inter-metallic phase structure and a liquidus temperature of approximately 355° C.; and wherein said fourth lead free off-eutectic solder composition is about 95.5 weight % Sn and 3.8 weight % Ag and 0.7 weight % Cu and has a liquidus temperature of approximately 217° C.

33. A solder interconnect structure for electronic package interconnections comprising:

at least one electronic circuit chip attached to a top side of a chip carrier with a first array of solder connections, said first array of solder connections having a first lead free off-eutectic solder composition;

at least one passive component attached to said chip carrier with a second lead free off-eutectic solder composition, said second lead free off-eutectic solder composition having a lower liquidus temperature than said first lead free off-eutectic solder composition;

a second array of solder connections having a first end attached to a bottom side of said chip carrier with said second lead free off-eutectic solder composition; and a circuit board having a top side attached to a second end of said second array of solder connections by a third lead free solder composition, said third lead free solder composition having a lower liquidus temperature than said second off-eutectic lead free solder composition to create a solder interconnect structure.

34. The solder interconnect structure of claim 33 wherein said first lead free off-eutectic solder composition is about 72.0 weight % Sn and 28.0 weight % Ag, and having dispersed grains of SnAg inter-metallic phase structure and a liquidus temperature of approximately 400° C.;

wherein said second lead free off-eutectic solder composition is about 82.0 weight % Sn and 18.0 weight % Ag, and having dispersed grains of SnAg inter-metallic phase structure and a liquidus temperature of approximately 355° C.; and wherein said third lead free off-eutectic solder composition is about 95.5 weight % Sn and 3.8 weight % Ag and 0.7 weight % Cu and has a liquidus temperature of approximately 217° C.

35. A solder interconnect structure for electronic package interconnections comprising:

at least one electronic circuit chip attached to a top side of a chip carrier with a first array of solder connections, said first array of solder connections having a first lead free off-eutectic solder composition;

at least one passive component attached to said chip carrier with a solder composition;

a second array of solder connections having a first end attached to a bottom side of said chip carrier with a second lead free off-eutectic solder composition, said second lead free off-eutectic solder composition having a lower liquidus temperature than said first lead free off-eutectic solder composition; and a circuit board having a top side attached to a second end of said second array of solder connections by a third lead free solder composition, said third lead free solder composition having a lower liquidus temperature than said second off-eutectic lead free solder composition to create a solder interconnect structure.

36. The solder interconnect structure of claim 35 further comprising at least one passive component attached to said chip carrier with a Sn/Pb solder composition having a liquidus temperature lower than the liquidus temperature of said first lead free off-eutectic solder composition.

37. The solder interconnect structure of claim 35 further comprising at least one passive component attached to said chip carrier with a Sn/Bi solder composition having a liquidus temperature lower than the liquidus temperature of said first lead free off-eutectic solder composition.

38. The solder interconnect structure of claim 35 further comprising at least one passive component attached to said chip carrier with a Sn/In solder composition having a liquidus temperature lower than the liquidus temperature of said first lead free off-eutectic solder composition.

39. A solder interconnect structure for electronic package interconnections comprising:
  at least one electronic circuit chip attached to a top side of a chip carrier with a first array of solder connections, said first array of solder connections having a first lead free off-eutectic solder composition;
  at least one passive component attached to said chip carrier with a second lead free off-eutectic solder composition, said second lead free off-eutectic solder composition having a lower liquidus temperature than said first lead free off-eutectic solder composition;
  a second array of solder connections having a first end attached to a bottom side of said chip carrier with a third lead free off-eutectic solder composition, said third lead free off-eutectic solder composition having a lower liquidus temperature than said second lead free off-eutectic solder composition; and
  a circuit board having a top side attached to a second end of said second array of solder connections by a eutectic Sn/Pb solder composition.

40. A solder hierarchy structure for electronic package interconnections comprising:
  an electronic module;
  an array of solder columns having a first end attached to a bottom side of said module with a lead free solder Sn/Ag solder composition of approximately 72 to 96.5 weight % Sn and approximately 28 to 3.5 weight % Ag and
  a circuit board having a top side attached to a second end of said array of solder columns by a Sn/Pb solder composition of approximately 63 weight % Sn and 37 weight % Pb.

41. The solder hierarchy structure of claim 40 wherein said lead free solder composition is comprised of approximately 78 weight % Sn and 22 weight % Ag and said Sn/Pb solder composition is approximately 63 weight % Sn and 37 weight % Pb.

42. The solder hierarchy structure of claim 40 wherein said lead free solder composition is comprised of approximately 82 weight % Sn and 18 weight % Ag and said Sn/Pb solder composition is approximately 63 weight % Sn and 37 weight % Pb.

43. The solder hierarchy structure of claim 40 wherein said lead free solder composition is comprised of approximately 72 weight % Sn and 28 weight % Ag and said Sn/Pb solder composition is approximately 63 weight % Sn and 37 weight % Pb.

44. The solder hierarchy structure of claim 40 wherein said lead free solder composition is comprised of approximately 96.5 weight % Sn and 3.5 weight % Ag and said Sn/Pb solder composition is approximately 63 weight % Sn and 37 weight % Pb.

45. The solder hierarchy structure of claim 40 wherein said lead free solder composition is comprised of approximately 93 weight % Sn and 7 weight % Cu and said Sn/Pb solder composition is approximately 63 weight % Sn and 37 weight % Pb.

46. The solder hierarchy structure of claim 40 wherein said lead free solder composition is comprised of approximately 97 weight % Sn and 3 weight % Cu and said Sn/Pb solder composition is approximately 63 weight % Sn and 37 weight % Pb.

47. The solder hierarchy structure of claim 40 wherein said lead free solder composition is comprised of approximately 99.3 weight % Sn and 0.7 weight % Cu and said Sn/Pb solder composition is approximately 63 weight % Sn and 37 weight % Pb.

48. A lead free solder structure for attaching a heat sink to a circuit chip comprising:
  a circuit chip;
  metallized layers on said chip;
  a heat sink;
  metallized layers on said heat sink; and
  a lead free solder connecting said heat sink to said chip.

49. The lead free solder structure of claim 48 wherein said lead free solder is a Sn/Ag solder composition comprised of approximately 72 to 96.5 weight % Sn and 28 to 3.5 weight % Ag.

50. The lead free solder structure of claim 48 wherein said lead free solder is a Sn/Cu solder composition comprised of approximately 93 to 99.3 weight % Sn and 7 to 0.7 weight % Cu.

51. The lead free solder structure of claim 48 wherein said lead free solder is a layered solder preform of Sn/Ag/Sn.

52. The lead free solder structure of claim 51 wherein said lead free layered solder preform comprises:
  a first layer of Sn approximately 10 mils thick;
  a layer of Ag approximately 5 mils thick said layer of Ag contiguous with said first layer of Sn; and
  a second layer of Sn approximately 10 mil thick, said second layer of Sn contiguous with said layer of Ag.

53. A solder hierarchy structure for electronic package interconnections comprising:
  an electronic module;
  an array of solder columns having a first end attached to a bottom side of said module with a lead free Sn/Cu solder composition of approximately 93 to 99.3 weight % Sn and approximately 7 to 0.7 weight % Cu; and
  a circuit board having a tope side attached to a second end of said array of solder columns by a Sn/Pb composition of approximately 63 weight % Sn and 37 weight % Pb.

* * * * *